US012586978B2

(12) United States Patent
Gillespie et al.

(10) Patent No.: US 12,586,978 B2
(45) Date of Patent: Mar. 24, 2026

(54) APPARATUS FOR AND METHOD OF GENERATING MULTIPLE LASER BEAMS

(71) Applicant: Cymer, LLC, San Diego, CA (US)

(72) Inventors: Walter Dale Gillespie, Poway, CA (US); Joshua Jon Thornes, San Diego, CA (US); Thomas Patrick Duffey, San Diego, CA (US); Eric Anders Mason, San Diego, CA (US); Rabin Paudel, San Diego, CA (US)

(73) Assignee: Cymer, LLC, San Diego, CA (US)

( * ) Notice: Subject to any disclaimer, the term of this patent is extended or adjusted under 35 U.S.C. 154(b) by 1158 days.

(21) Appl. No.: 17/612,035

(22) PCT Filed: May 15, 2020

(86) PCT No.: PCT/US2020/033262
§ 371 (c)(1),
(2) Date: Nov. 17, 2021

(87) PCT Pub. No.: WO2020/236647
PCT Pub. Date: Nov. 26, 2020

(65) Prior Publication Data
US 2022/0255288 A1      Aug. 11, 2022

Related U.S. Application Data

(60) Provisional application No. 63/006,162, filed on Apr. 7, 2020, provisional application No. 62/978,515, filed
(Continued)

(51) Int. Cl.
*H01S 3/225* (2006.01)
*G03F 7/00* (2006.01)
(Continued)

(52) U.S. Cl.
CPC .......... *H01S 3/225* (2013.01); *G03F 7/70025* (2013.01); *G03F 7/70575* (2013.01); *H01S 3/10046* (2013.01); *H01S 3/134* (2013.01)

(58) Field of Classification Search
CPC .......................... H01S 3/0943; H01S 3/0979
See application file for complete search history.

(56) References Cited

U.S. PATENT DOCUMENTS 5,142,543 A      8/1992   Wakabayashi et al.
6,139,166 A    10/2000   Marshall et al.
(Continued)

FOREIGN PATENT DOCUMENTS

DE           10010619 A1      9/2001
DE     1020122181051 A1      8/2019
(Continued)

OTHER PUBLICATIONS

Patrik Flierl, European International Searching Authority, International Search Report and Written Opinion, counterpart PCT Application No. PCT/US2020/033262, mailed Aug. 26, 2020, 9 pages total.
(Continued)

*Primary Examiner* — Minsun O Harvey
(74) *Attorney, Agent, or Firm* — Diberardino McGovern IP Group LLC

(57) ABSTRACT
Apparatus for and method of generating multiple laser beams using multiple laser chambers. The relative timing of the beams is controllable so they may, for example, be interleaved, may overlap, or be prevented from overlapping, or may occur in rapid sequence. The beams may have different spectral and power characteristics such as different wavelengths. Also disclosed is a system in which at least one of the multiple laser chambers is configured to generate radiation of two different wavelengths.

38 Claims, 6 Drawing Sheets

Related U.S. Application Data on Feb. 19, 2020, provisional application No. 62/853,772, filed on May 29, 2019, provisional application No. 62/851,147, filed on May 22, 2019.

(51) Int. Cl.

| | | |
|---|---|---|
| *H01S 3/10* | (2006.01) | |
| *H01S 3/134* | (2006.01) | |

(56) References Cited

U.S. PATENT DOCUMENTS

| | | | |
|---|---|---|---|
| 6,243,405 | B1 | 6/2001 | Borneis et al. |
| 6,541,731 | B2 | 4/2003 | Mead et al. |
| 6,671,294 | B2 | 12/2003 | Kroyan et al. |
| 6,735,225 | B2 | 5/2004 | Albrecht et al. |
| 6,829,040 | B1 | 12/2004 | Kye et al. |
| 6,853,653 | B2 | 2/2005 | Spangler et al. |
| 7,002,443 | B2 | 2/2006 | Ness et al. |
| 7,039,086 | B2 | 5/2006 | Fallon et al. |
| 7,079,564 | B2 | 7/2006 | Fallon et al. |
| 7,088,758 | B2 | 8/2006 | Sandstrom et al. |
| 7,154,928 | B2 | 12/2006 | Sandstrom et al. |
| 7,158,553 | B2 | 1/2007 | Govorkov et al. |
| 7,256,870 | B2 | 8/2007 | Finders |
| 7,286,207 | B2 | 10/2007 | Nolscher et al. |
| 7,408,714 | B2 | 8/2008 | Windpassinger et al. |
| 7,525,638 | B2 | 4/2009 | Buurman et al. |
| 7,534,552 | B2 | 5/2009 | De Kruif et al. |
| 7,612,868 | B2 | 11/2009 | Tsuchiya |
| 7,642,533 | B2 * | 1/2010 | Partio et al. ............ H01J 35/20 |
| | | | 250/504 R |
| 7,965,387 | B2 | 6/2011 | Hagiwara |
| RE43,605 | E | 8/2012 | O'Brien et al. |
| 8,309,885 | B2 | 11/2012 | Peng et al. |
| 8,705,004 | B2 | 4/2014 | Butler et al. |
| 8,938,694 | B2 | 1/2015 | Liu et al. |
| 8,989,225 | B2 | 3/2015 | Kakizaki et al. |
| 9,207,119 | B2 | 12/2015 | Rokitski et al. |
| 9,235,136 | B2 | 1/2016 | Epple |
| 9,599,510 | B2 | 3/2017 | Duffey et al. |
| 9,625,824 | B2 | 4/2017 | Lu et al. |
| 9,904,068 | B1 * | 2/2018 | Stinson et al. ........... A61N 5/06 |
| 9,989,864 | B2 | 6/2018 | Baselmans et al. |
| 9,989,866 | B2 | 6/2018 | Mason et al. |
| 2002/0006149 | A1 | 1/2002 | Spangler et al. |
| 2002/0048288 | A1 | 4/2002 | Kroyan et al. |
| 2002/0106821 | A1 | 8/2002 | Bode et al. |
| 2002/0126479 | A1 | 9/2002 | Zhai et al. |
| 2003/0016708 | A1 | 1/2003 | Albrecht et al. |
| 2003/0090643 | A1 | 5/2003 | Sato |
| 2003/0099269 | A1 * | 5/2003 | Ershov ................... H01S 3/223 |
| | | | 372/55 |
| 2003/0178583 | A1 | 9/2003 | Kampherbeek et al. |
| 2003/0219094 | A1 * | 11/2003 | Basting ................. G03F 7/7005 |
| | | | 378/34 |
| 2004/0057489 | A1 | 3/2004 | Fallon et al. |
| 2005/0078292 | A1 | 4/2005 | Bruebach |
| 2005/0083983 | A1 | 4/2005 | Sandstrom et al. |
| 2005/0247683 | A1 | 11/2005 | Agarwal et al. |
| 2005/0265417 | A1 | 12/2005 | Fallon et al. |
| 2006/0261050 | A1 | 11/2006 | Krishnan et al. |
| 2007/0013889 | A1 | 1/2007 | Jorritsma et al. |
| 2007/0222961 | A1 | 9/2007 | Schmidt |
| 2007/0260419 | A1 | 11/2007 | Hagiwara |
| 2008/0198891 | A1 | 8/2008 | Hori et al. |
| 2009/0002666 | A1 | 1/2009 | Tsuchiya |
| 2009/0219498 | A1 | 9/2009 | Kono |

| | | | |
|---|---|---|---|
| 2010/0177794 | A1 | 7/2010 | Peng et al. |
| 2012/0087386 | A1 | 4/2012 | Brown et al. |
| 2013/0279526 | A1 | 10/2013 | Kakizaki et al. |
| 2014/0195993 | A1 | 7/2014 | Liu et al. |
| 2014/0236516 | A1 | 8/2014 | Pforr |
| 2015/0380893 | A1 | 12/2015 | Matsunaga et al. |
| 2016/0219684 | A1 | 7/2016 | Kaskey et al. |
| 2016/0320708 | A1 | 11/2016 | Lu et al. |
| 2016/0341602 | A1 | 11/2016 | Thornes |
| 2017/0063025 | A1 | 3/2017 | Wakabayashi et al. |
| 2017/0160647 | A1 | 6/2017 | Baselmans et al. |
| 2017/0176879 | A1 | 6/2017 | Witte et al. |
| 2017/0187160 | A1 | 6/2017 | Lowder et al. |
| 2017/0279241 | A1 | 9/2017 | Onose et al. |
| 2018/0109068 | A1 | 4/2018 | Conley et al. |
| 2018/0123312 | A1 | 5/2018 | Furusato et al. |
| 2018/0254600 | A1 | 9/2018 | Kumazaki et al. |
| 2018/0323568 | A1 | 11/2018 | Furusato et al. |
| 2019/0173258 | A1 | 6/2019 | Miyamoto et al. |

FOREIGN PATENT DOCUMENTS

| | | | |
|---|---|---|---|
| JP | 11204894 | A | 7/1999 |
| JP | 2003031881 | A | 1/2003 |
| JP | 2004146793 | A | 5/2004 |
| JP | 2005142306 | A | 6/2005 |
| JP | 2008198919 | A | 8/2008 |
| JP | 4577064 | B2 | 11/2010 |
| JP | 4580246 | B2 | 11/2010 |
| JP | 2016224321 | A | 12/2016 |
| KR | 20060052927 | A | 5/2006 |
| KR | 20060125905 | A | 12/2006 |
| TW | 492234 | B | 6/2002 |
| TW | 200512546 | A | 4/2005 |
| TW | 200601732 | A | 1/2006 |
| TW | 200737625 | A | 10/2007 |
| TW | 201706579 | A | 2/2017 |
| TW | 201725355 | A | 7/2017 |
| WO | 2003096492 | A2 | 11/2003 |
| WO | 2005089131 | A3 | 6/2006 |
| WO | 2005094205 | A3 | 8/2007 |
| WO | 2008052153 | A2 | 5/2008 |
| WO | 2009018664 | A2 | 2/2009 |
| WO | 2016194378 | A1 | 12/2016 |
| WO | 2016209669 | A1 | 12/2016 |
| WO | 2017026000 | A1 | 2/2017 |
| WO | 2017050506 | A1 | 3/2017 |
| WO | 2017098625 | A1 | 6/2017 |
| WO | 2018061098 | A1 | 4/2018 |
| WO | 2019079010 | A1 | 4/2019 |
| WO | 2019174885 | A1 | 9/2019 |
| WO | 2019190700 | A1 | 10/2019 |

OTHER PUBLICATIONS

Office Action, counterpart Taiwanese Patent Application No. 109116976, mailed Nov. 8, 2022, 23 pages total (including English translation of 9 pages).

Office Action, counterpart Japanese Patent Application No. 2021-566461, mailed Jan. 18, 2023, 6 pages total (including English translation of 3 pages).

Office Action, counterpart Korean Patent Application No. 10-2021-7037821, mailed Jan. 30, 2023, 15 pages total (including English translation of 6 pages).

Office Action, counterpart Japanese Patent Application No. 2021-566461, mailed Jun. 8, 2023, 7 pages total (including English translation of 4 pages).

* cited by examiner

APPARATUS FOR AND METHOD OF GENERATING MULTIPLE LASER BEAMS

CROSS REFERENCE TO RELATED APPLICATIONS

This application claims priority to U.S. Application No. 62/853,772, filed May 29, 2019 and titled APPARATUS FOR AND METHOD OF GENERATING MULTIPLE LASER BEAMS, and U.S. Application No. 62/978,515, filed Feb. 19, 2020 and titled APPARATUS FOR AND METHOD OF GENERATING MULTIPLE LASER BEAMS, both of which are incorporated herein in their entireties by reference.

This application also claims priority to U.S. Application No. 62/851,147, filed May 22, 2019 and titled CONTROL SYSTEM FOR A PLURALITY OF DEEP ULTRAVIOLET OPTICAL OSCILLATORS, and U.S. Application No. 63/006,162, filed Apr. 7, 2020 and titled CONTROL SYSTEM FOR A PLURALITY OF DEEP ULTRAVIOLET OPTICAL OSCILLATORS, both of which are also incorporated herein in their entireties by reference.

FIELD

The present disclosure relates to generating multiple laser beams for use, for example, in a lithographic apparatus.

BACKGROUND

A lithographic apparatus applies a desired pattern onto a substrate such as a wafer of semiconductor material, usually onto a target portion of the substrate. A patterning device, which is alternatively referred to as a mask or a reticle, may be used to generate a circuit pattern to be formed on an individual layer of the wafer. Transfer of the pattern is typically accomplished by imaging onto a layer of radiation-sensitive material (resist) provided on the substrate. In general, a single substrate will contain adjacent target portions that are successively patterned.

Lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate. Herein, for the sake of simplicity, both steppers and scanners will be referred to simply as scanners.

The light source used to illuminate the pattern and project it onto the substrate can be of any one of a number of configurations. Deep ultraviolet excimer lasers commonly used in lithography systems include the krypton fluoride (KrF) laser at 248 nm wavelength and the argon fluoride (ArF) laser at 193 nm wavelength. Generally, an excimer laser is designed to operate with a specific gas mixture. While small slow adjustments in wavelength can readily be made, rapidly changing wavelength is not a trivial matter.

There may be instances, however, where it is desired to have the capability of changing wavelength. For example, in 3D NAND tiers of memory capacity are stacked on top of each other. The transition from 2D to 3D NAND architecture requires significant changes in manufacturing processes. In 3D NAND fabrication the challenges are driven primarily by the processes of etching and deposition at extreme aspect ratios (for example, the ratio of a hole diameter to its depth). Creating complex 3D structures with very high-aspect-ration (HAR) features is complicated and requires extreme precision and, ultimately, process uniformity and repeatability to achieve reliable high volume manufacturing. Moreover, as multi-layered stack heights increase, so does the difficulty in achieving consistent etch and deposition results at the top and the bottom of the memory array.

These considerations lead to a need for a greater depth of focus. Lithography depth of focus (DOF) is determined by the relationship $DOF=\pm m\ \lambda/(NA)^2$ where $\lambda$ is the wavelength of the illuminating light, NA is numerical aperture, and in is a practical factor depending on the resist process. Due to greater depth-of-focus requirements in 3D NAND lithography, sometimes more than one exposure pass is made over a wafer using a different focal plane for each pass. One method involves changing the wafer stage height for each pass. Changing the wavelength is another method to achieve the same effect. The materials making up the lenses that focus the laser radiation typically have some nonzero dispersion, so different wavelengths come to focus at different depths. For this reason it may be desirable to have the ability to change wavelengths rapidly.

Beyond wavelength considerations, the use of higher dose resists for KrF lasers leads to a requirement for KrF lasers having higher power. For example, it may be desirable for some applications to have a KrF laser capable of providing as much as 120 W.

There is a need for laser systems that can provide flexible wavelength switching and/or higher power illumination.

SUMMARY

The following presents a simplified summary of one or more embodiments in order to provide a basic understanding of the embodiments. This summary is not an extensive overview of all contemplated embodiments, and is not intended to identify key or critical elements of all embodiments nor delineate the scope of any or all embodiments. Its sole purpose is to present some concepts of one or more embodiments in a simplified form as a prelude to the more detailed description that is presented later.

According to one aspect of an embodiment there is disclosed a laser system having two independent laser chambers or cavities. The control of at least two wavelengths can be achieved with these two independent cavities. The beams may be spatially or temporally overlapped to provide higher power than could be supplied by either of the beams individually. Putting two lasers into one platform does not increase cost of operations for lower power processes, as only one cavity need be used at a time. By putting two lasers together with one scanner, service intervals could be doubled if higher powers are not required. This would not be possible for master power amplifier (MOPA) or similar two chamber systems.

According to another aspect of an embodiment the system may include components to allow the user to use either one of the chambers singly for low power processes or two chambers in concert for high power processes.

According to another aspect of an embodiment the relative firing time of the two chambers may be controlled such that the chambers may be fired concurrently, or with a slight delay of the firing of one chamber with respect to the other, or firing could be interleaved to essentially double the effective repetition used in the scanner.

According to another aspect of an embodiment, there is disclosed a gas discharge laser system comprising a first laser chamber module adapted to generate a first beam of laser radiation at a first wavelength, a second laser chamber module adapted to generate a second beam of laser radiation at a second wavelength different from the first wavelength, and a beam combiner arranged to receive the first beam and the second beam and adapted to propagate the first beam and the second beam along a common output beam path. The first laser chamber module may comprise a first excimer laser chamber module. The first laser chamber module may comprise an ArF laser chamber module. The first excimer laser chamber module may comprise a KrF laser chamber module. The second laser chamber module may comprise a second excimer laser chamber module. The second laser chamber module may comprise an ArF laser chamber module. The second excimer laser chamber module may comprise a KrF laser chamber module. The gas discharge laser system may further comprise a third laser chamber module adapted to generate a third beam of laser radiation and the beam combiner may be arranged to receive the third beam and to propagate the third beam along the common output beam path.

The gas discharge laser system may further comprise a discharge timing circuit arranged to control a relative timing of discharge in the first laser chamber module with respect to the second laser chamber module. The discharge timing circuit may be adapted to control the relative timing of discharge in the first laser chamber module with respect to the second laser chamber module such that the first laser chamber module discharges at a first repetition rate and the second laser chamber module discharge at a second repetition rate substantially the same as the first repetition rate and offset relative to the first repetition rate by half the period of the first repetition rate. The discharge timing circuit may be adapted to control the relative timing of discharge in the first laser chamber module with respect to the second laser chamber module such that the first laser chamber module and the second laser chamber module discharge at substantially the same repetition rate, and wherein the second laser chamber module discharges substantially immediately after the first laser chamber module finishes discharging. The discharge timing circuit may be adapted to control the relative timing of discharge in the first laser chamber module with respect to the second laser chamber module such that the first laser chamber module and the second laser chamber module discharge at substantially the same time. The discharge timing circuit may be adapted to control the relative timing of discharge in the first laser chamber module with respect to the second laser chamber module such that the first laser chamber module and the second laser chamber module do not discharge at substantially the same time. The discharge timing circuit may be adapted to generate a common command to fire both the first laser chamber module and the second laser chamber module.

The first laser chamber module may adapted to fire without a delay after the common command. The first laser chamber module may be adapted to fire with a delay after the common command. The second laser chamber module may be adapted to fire without a delay after the common command. The second laser chamber module may be adapted to fire with a delay after the common command.

The discharge timing circuit may be adapted to generate a first command to fire the first laser chamber module and a second command to fire the second laser chamber module. The first laser chamber module may be adapted to fire without a delay after the first command. The first laser chamber module may be adapted to fire with a delay after the first command. The second laser chamber module may be adapted to fire without a delay after the second command. The second laser chamber module may be adapted to fire with a delay after the command. The first laser chamber module may be fired at a first repetition rate and the second laser chamber module may be fired at a second repetition rate different from the first repetition rate. The discharge rate ratio of the first repetition rate to the second repetition rate may be a ratio of two integers which may, for example, be 2:1 or 3:2.

The gas discharge laser system may further comprise a control system adapted to control both of the first laser chamber module and the second laser chamber module. The gas discharge laser system may further comprise a gas supply system adapted to supply gas to both of the first laser chamber module and the second laser chamber module. The gas discharge laser system may further comprise a first laser chamber metrology unit arranged to measure a parameter of the light beam generated by the first laser chamber module. The gas discharge laser system may further comprise a second laser chamber metrology unit arranged to measure a parameter of the light beam generated by the second laser chamber module. The gas discharge laser system may further comprise a combined beam metrology unit arranged to measure a parameter of a combination of the light beam generated by the first laser chamber module and the light beam generated by the second laser chamber module. The gas discharge laser system may further comprise a control unit arranged to receive an output from the first laser chamber metrology unit and configured to control a wavelength of the light beam generated by the first laser chamber module based at least in part on the output of the first laser chamber metrology unit. The gas discharge laser system may further comprise a control unit arranged to receive an output from the second laser chamber metrology unit and configured to control a wavelength of the light beam generated by the second laser chamber module based at least in part on the output of the second laser chamber metrology unit. The gas discharge laser system may further comprise a control unit arranged to receive the output of the combined beam metrology unit and configured to control a spectrum of a combination of the light beam generated by the first laser chamber module and the light beam generated by the second laser chamber module based at least in part on the output of the combined beam metrology unit. The gas discharge laser system may further comprise a first laser chamber line narrowing module arranged to receive the light beam from the first laser chamber module and configured to narrow the bandwidth of the light beam from the first laser chamber module. The gas discharge laser system may further comprise a second laser chamber line narrowing module arranged to receive the light beam from the second laser chamber module and configured to narrow the bandwidth of the light beam from the second laser chamber module. The gas discharge laser system may further comprise a second laser chamber line narrowing module arranged to receive the light beam from the second laser chamber module and configured to narrow the bandwidth of the light beam from the second laser chamber module, and a control unit connected to the first laser chamber line narrowing module and second laser chamber line narrowing module and adapted to control the first laser chamber line narrowing module and second laser chamber line narrowing module so that the first bandwidth is substantially the same as the second bandwidth. The gas discharge laser system may further comprise a second laser chamber line narrowing module arranged to receive the light beam from the second laser chamber module and configured to narrow the bandwidth of the light beam from the second laser chamber module, and a control unit connected to the first laser chamber line narrowing module and second laser chamber line narrowing module and adapted to control the first laser chamber line narrowing module and second laser chamber line narrowing module so that the first bandwidth is different from the second bandwidth.

According to another aspect of an embodiment, there is disclosed a lithography apparatus comprising a first laser chamber module adapted to generate first beam of laser radiation at a first wavelength, a second laser chamber module adapted to generate a second beam of laser radiation at a second wavelength different from the first wavelength, a beam combiner arranged to receive the first beam and the second beam and adapted to propagate the first beam and the second beam along a common output beam path, and a scanner arranged to receive the first beam and the second beam, wherein the scanner is configured to provide an instruction for adjusting the first and second wavelengths. The lithography apparatus may further comprise a discharge timing circuit arranged to control a relative timing of discharge in the first laser chamber module with respect to the second laser chamber module. The discharge timing circuit may be adapted to control the relative timing of discharge in the first laser chamber module with respect to the second laser chamber module such that the first laser chamber module and the second laser chamber module discharge at substantially the same repetition rate and 180 degrees out of phase with each other. The discharge timing circuit may be adapted to control the relative timing of discharge in the first laser chamber module with respect to the second laser chamber module such that the first laser chamber module and the second laser chamber module discharge at substantially the same repetition rate, and the second laser chamber module discharges substantially immediately after the first laser chamber module finishes discharging. The discharge timing circuit may be adapted to control the relative timing of discharge in the first laser chamber module with respect to the second laser chamber module such that the first laser chamber module and the second laser chamber module discharge at substantially the same time. The discharge timing circuit may be adapted to control the relative timing of discharge in the first laser chamber module with respect to the second laser chamber module such that the first laser chamber module and the second laser chamber module do not discharge at substantially the same time. The lithography apparatus may further comprise a control system adapted to control both the first laser chamber module and the second laser chamber module. The lithography apparatus may further comprise a gas supply system adapted to supply gas to both the first laser chamber module and the second laser chamber module.

According to another aspect of an embodiment, there is disclosed a method of exposing a substrate in a lithography apparatus, the method comprising the steps of receiving, from a scanner, an indication of one or more target wavelengths, generating, in response to the indication, a first beam of laser radiation at a first wavelength using a first laser chamber module, generating, in response to the indication, a second beam of laser radiation at a second wavelength different from the first wavelength using a second laser chamber module, causing the first beam and the second beam to propagate along a common output beam path, and using the first beam and the second beam in the scanner to expose the substrate to radiation at the first wavelength and radiation at the second wavelength in a single pass. The method may further comprise a step of controlling a relative timing of the step of generating the first beam of laser radiation at the first wavelength and generating the second beam of laser radiation at the second wavelength different from the first wavelength. The step of controlling a relative timing of the step of generating the first beam of laser radiation at the first wavelength and generating the second beam of laser radiation at the second wavelength different from the first wavelength may comprise generating the first beam of laser radiation and the second beam of laser radiation at substantially the same repetition rate and 180 degrees out of phase with each other. The step of controlling a relative timing of the step of generating the first beam of laser radiation at the first wavelength and generating the second beam of laser radiation at the second wavelength different from the first wavelength may comprise generating the first beam of laser radiation and the second beam of laser radiation at substantially the same repetition rate and generating the second beam substantially immediately after generating the first beam. The step of controlling a relative timing of the step of generating the first beam of laser radiation at the first wavelength and generating the second beam of laser radiation at the second wavelength different from the first wavelength may comprise generating the first beam of laser radiation and the second beam of laser radiation at substantially the same time. The step of controlling a relative timing of the step of generating the first beam of laser radiation at the first wavelength and generating the second beam of laser radiation at the second wavelength different from the first wavelength may comprise generating the first beam of laser radiation and the second beam of laser radiation at substantially the same time.

According to another aspect of an embodiment, there is disclosed a method of exposing a substrate in a lithography apparatus, the method comprising the steps of generating a first beam of laser radiation at a first wavelength using a first laser chamber module for a first number of pulses and propagating the pulses along an output beam path to the substrate, and generating a second beam of laser radiation at a second wavelength using a second laser chamber module for a second number of pulses and propagating the pulses along the output beam path to the substrate. The first wavelength may be substantially the same as the second wavelength. The first wavelength may be different from the second wavelength. The first number of pulses may be the same as the second number of pulses. The first number of pulses may be different from the second number of pulses. The first beam may have a first pulse energy and the second beam may have a second pulse energy different from the first pulse energy. The method may further comprise a step of narrowing a bandwidth of the light beam generated by the first laser chamber module. The method may further comprise a step of narrowing a bandwidth of the light beam generated by the second laser chamber module. The method may further comprise a step of narrowing a bandwidth of the light beam generated by the first laser chamber module a first amount and narrowing a bandwidth of the light beam generated by the second laser chamber module a second amount different from the first amount. The method may further comprise a step of generating a command signal wherein the steps of generating a first beam of laser radiation and generating a second beam of laser radiation are carried out in response to the command signal. The method may further comprise a step of generating a first command signal and the step of generating a second command signal, and wherein the step of generating a first beam of laser radiation is carried out in response to the first command signal and the step of generating a second command signal, and wherein the step of generating a second beam of laser radiation is carried out in response to the second command signal.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

The accompanying drawings, which are incorporated herein and form part of the specification, illustrate the present invention and, together with the description, further serve to explain the principles of the present invention and to enable a person skilled in the relevant art(s) to make and use the present invention.

Figure 1:
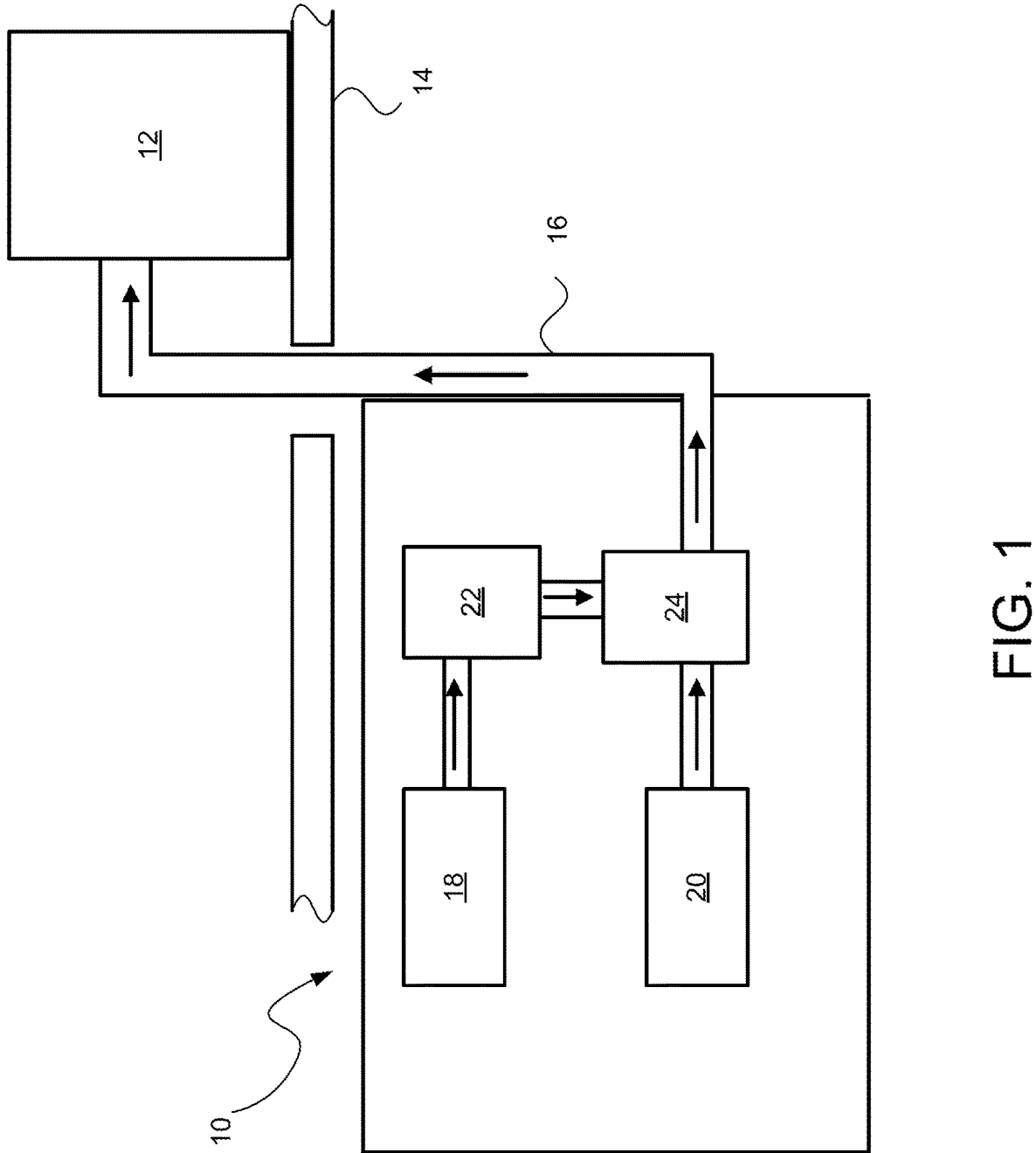
FIG. 1 is a functional block diagram of a conventional two-chamber laser system.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

It would benefit wafer throughput rates to be able to avoid the need for additional exposure passes. It would also be beneficial to be able to increase the amount of power delivered to the wafer past the limits of what a single laser can provide. This can theoretically be accomplished by using two lasers with overlaid beams connected to the scanner, thus permitting multiple wavelength exposure to be accomplished in a single pass. Because a single KrF laser has a maximum power, higher power could be achieved by connecting two lasers to a single scanner. However, using two individual lasers takes up additional floor space in the fabrication facility and entails doubling of laser subsystems (gas handling, power distribution, enclosure and mechanical structures, for example). There is a need for an efficient manner of generating multiple laser beams without fully duplicating all of the components of an entire laser system.

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing embodiments in more detail, it is instructive to present an example environment in which embodiments of the present invention may be implemented. FIG. 1 is a functional block diagram of a conventional two-chamber laser system 10. In this embodiment a laser beam is provided at the input port of a lithography machine 12 such as a stepper or scanner machine. The main components of the laser system 10 may be installed below the floor 14 on which the scanner 12 is installed as shown. The laser system 10 includes a beam delivery unit 16, which provides an enclosed beam path for delivering the laser beam to the input port of scanner 12. The particular light source system illustrated includes a master oscillator 18 and a power amplifier 20 and is a type of laser system known as master oscillator power amplifier or MOPA system. The laser system 10 also includes various components for control of the spectral characteristics of the pulses, shaping the pulses, and so on which are generally indicated as optics 22 and optics 24. Additional details of arrangement and operation of such a laser system can be found, for example, in U.S. Pat. No. 7,079,564, titled "Control System for a Two Chamber Gas Discharge Laser" issued Jul. 18, 2006, the entire contents of which are incorporated by reference herein.

The master oscillator 18 and the power amplifier 20 each contain two elongated electrodes, a laser gas, a fan for circulating the gas between the electrodes, and water-cooled finned heat exchangers. The master oscillator 18 produces a first laser beam which is amplified by two passes through the power amplifier 20 to produce an output laser beam as indicated by the arrows in FIG. 1.

Figure 2:
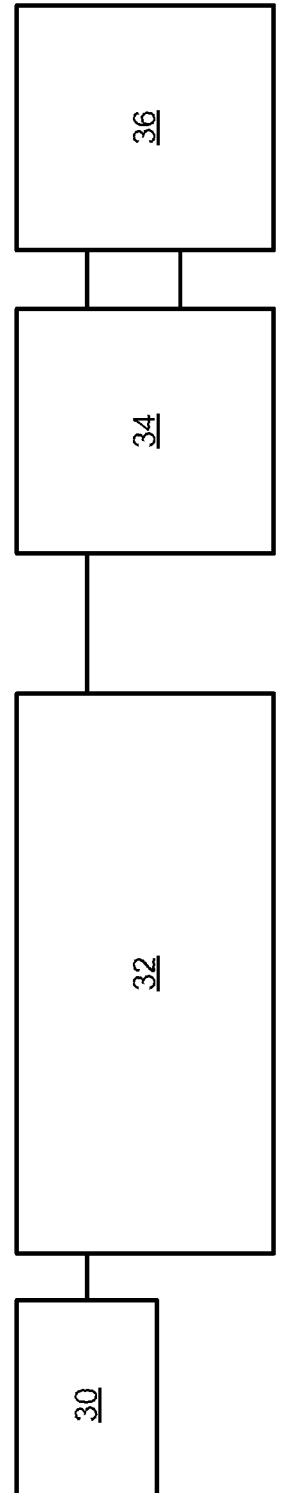
FIG. 2 is a functional block diagram of a conventional pulse power circuit as might be used in the system of FIG. 1

Turning to FIG. 2 there is shown a pulse power circuit that includes, e.g., a high voltage resonant power supply 30, commutator module 32, compression head module 34, and a laser chamber module 36. High voltage resonant power supply module 30 converts three phase normal plant power to a high DC voltage. The commutator module 32 and compression head module 34 compress and amplify the electrical energy from the resonant power supply module 30 to produce a pulse with the desired discharge voltage across the electrodes in the laser chamber module 36. Further details on the operation of this circuitry may be found in U.S. Pat. No. 7,002,443, titled "Method and Apparatus for Cooling Magnetic Circuit Elements", issued Feb. 21, 2006, the entire contents of which are incorporated by reference herein.

Light sources used in advanced photolithography usually require a light source with narrow spectral bandwidth to support achieving the necessary uniformity in the critical dimension printed on a substrate (CD uniformity or CDU). However, this also limits the process window available to chipmakers in high NA systems where the depth of focus is small. The challenge for contact layers in particular is the decreasing process window area with reducing feature sizes.

A technology referred to as focus drilling technology supports a larger process window in the patterning of contact and via layers. Focus drilling requires a broad spectral bandwidth tuning capability along with the necessary supporting metrology and control capability, thereby providing increased process latitude to chipmakers. One method of spectral tuning is referred to as RELAX. See I. Lalovic et al., "RELAX: Resolution Enhancement by Laser-spectrum Adjusted Exposure", Optical Microlithography VXIII, Proc. of SPIE Vol 5754, 2005, the contents of which are hereby incorporated by reference herein.

As indicated above, depth of focus is a function of wavelength. DOF is particularly important for 3D NAND. In this technology, the photoresist being applied is very thick, on the order of 1-15 $\mu$m, which vastly exceeds the typical DOF of scanner systems. Currently fabrication requires a two-step process in which the wafer is sent through with focus set multiple microns below the bottom of the structure and then again for a second pass with focus higher by a distance, for example, in a range of about 1 $\mu$m to about 4 $\mu$m.

According to an aspect of an embodiment, the need to subject the wafer to multiple passes is avoided by exposing the wafer to two beams of different wavelengths respectively generated by two separate laser cavities during a single exposure. Thus it is possible to adjust the depth of the focal plane, on a shot-to-shot basis, enabling illumination by multiple wavelengths in one pass for each target portion of a substrate.

Figure 3:
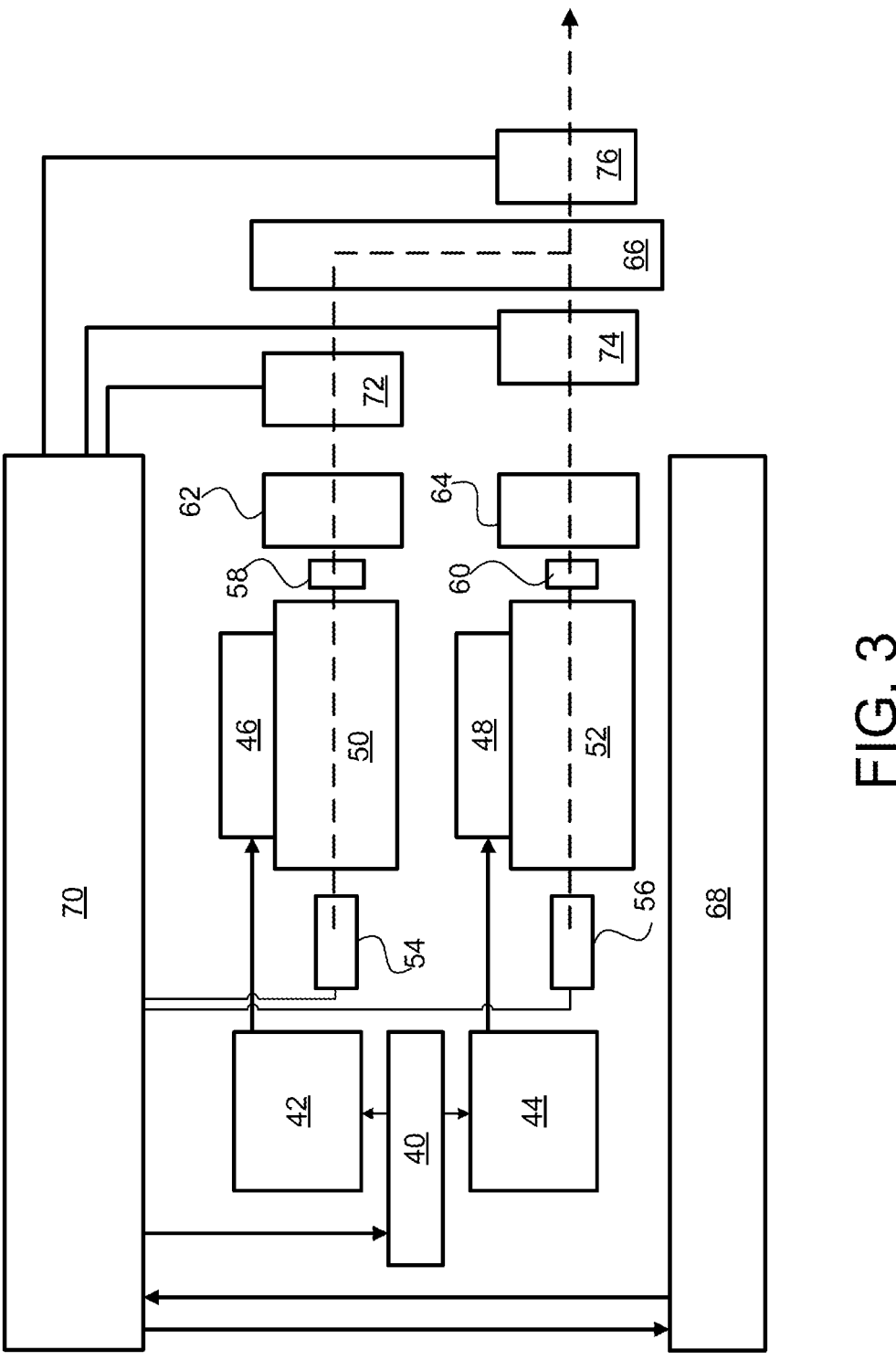
FIG. 3 is a functional block diagram of a two chamber laser system according to an aspect of an embodiment.

In the arrangement shown in FIG. 3, a first resonant charger 40 supplies electrical energy to a first commutator 42 and a second commutator 44. The first commutator 42 supplies a pulse to the first compression head 46. The second commutator 11 supplies a pulse to a second compression head 48. The first compression head 46 causes a discharge in the first laser chamber module 50. The second compression head 48 causes a discharge in the second laser chamber module 52. Also shown in FIG. 3 are optics for conditioning the laser beams such as a first line narrowing module 54 and second line narrowing module 56, a first optical coupler 58 and a second optical coupler 60 and a first stabilization module 62 and a second stabilization module 64. The beams produced by the laser chamber modules are line narrowed to produce a bandwidth much smaller than the natural bandwidth of the gas discharge system. A control circuit 70 may control the first line narrowing module 54 and the second line narrowing module 56 so that the bandwidth and wavelength of the light beams generated by the first laser chamber module 50 and the second laser chamber module 52 may be different from one another.

Various triggering arrangements could be employed. For example, one trigger could be used to fire both chambers, with or without a delay between the time of the trigger and the discharge for either or both of the chambers. Alternatively, the triggers may be generated separately, that is, by separate circuitry so that the two chambers would have distinct voltage/energy commands.

Also generally indicated by 68 are various system components that can be used in common by the first laser chamber module 50 and the second laser chamber module 52 such as gas handling systems, control systems, interfaces, power distribution systems, cooling water systems, power for the chamber filters and blowers, and beam path purge systems. Thus, in the arrangement shown, the two laser chambers can share use of these components, and it is unnecessary to have two of each of them.

The arrangement of FIG. 3 also includes a control circuit 70 capable of operating two lasers with independent energy, controlling relative firing times, bandwidth, and wavelength, and a scanner interface capable of dividing energy/pulse commands between two lasers.

The beam from the first laser chamber module 50 and the beam from the second laser chamber module 52 are combined by a beam combiner 66. One method of effecting the combination of beams from these two lasers in a single pass is to transmit them through a rotating prism. In one embodiment the first laser chamber module 50 generates laser radiation at a first wavelength while the second laser chamber module 52 generates laser radiation at a second wavelength different from the first wavelength. Thus, the two chambers cooperate to produce radiation at different wavelengths having different focal planes on the wafer and operating at different depths.

Also shown in FIG. 3 is a first metrology unit 72 arranged to measure parameters, including the wavelength, of the light beam generated by the first laser chamber module 50. The arrangement shown in FIG. 3 also includes a second metrology unit 74 arranged to measure parameters, including the wavelength, of the light beam generated by the second laser chamber module 52. A third metrology unit 76 is arranged to measure parameters, including the wavelength, of the combined beam, that is, parameters of the combination of the light beam from the first laser chamber module and the light beam from the second chamber module. It will be understood that there may be times when the combined beam is simply the beam from one of the laser chambers if the other chamber is not firing. The metrology units supply the results of their measurements to the control circuit 70. The metrology units as shown can measure the wavelength independently of the light from the two laser chamber modules and of the combined beam. The control unit 70 can use the measurements to control the wavelength of the light beam produced by each laser chamber module.

Figure 4:
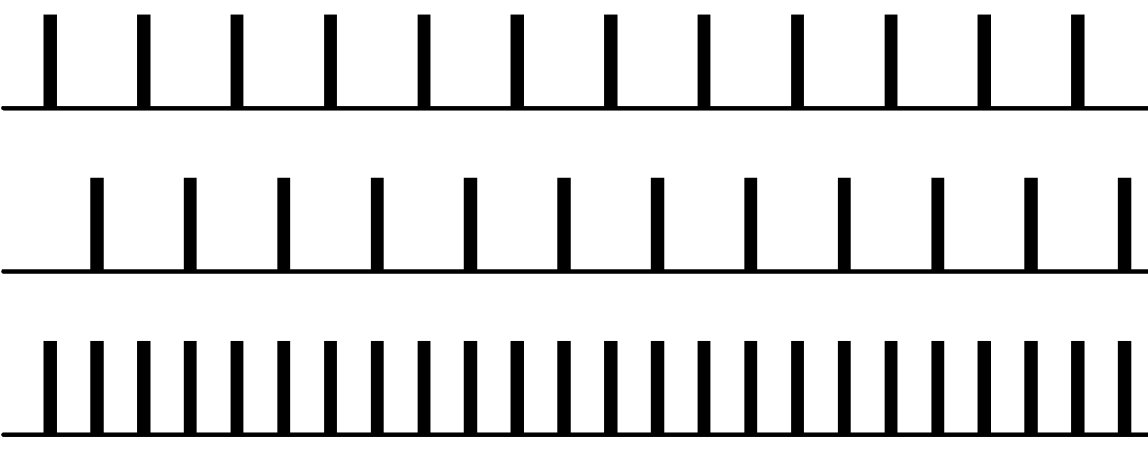
FIG. 4 is a diagram of a possible relative timing of discharges in two laser chambers according to an aspect of an embodiment.

The firing of the two chambers can be interleaved to achieve an effective doubled repetition rate. This is shown in FIG. 4. The top timing diagram shows a possible timing of firing of the first laser chamber module 50 and middle timing diagram shows a possible timing of firing the second laser chamber module 52. The beams from the two lasers can be combined to achieve an effective repetition rate that is twice the repetition rate of either of the two lasers as shown in the bottom timing diagram. As mentioned, any one of a number of arrangements can be used to combine the beam paths of the multiple lasers.

The firing sequences of the two (or more) laser chamber modules can be set to any one of a variety of patterns. For example, the sequences can be set so that the chambers alternate firing shot-by-shot. Alternatively the sequences can be set so that the first laser chamber module fires for a first number of shots and then the second chamber fires for a second number of shots, where the first and second number may or may not be equal. These sequences can be adopted with laser chamber modules generating light of the same wavelength or of different wavelengths. Also, the laser chamber modules generating light at two different wavelengths can be fired at substantially different repetition rates to create a spectrum with different energy content in each of the two wavelength beams. The second discharge rate may, for example, be an integral multiple of the first discharge rate, so that the discharge rates may be, for example, in a ratio of 2:1. The relationship of the first and second discharge rates may also be a ratio of two integers such as 3:2.

Figure 5:
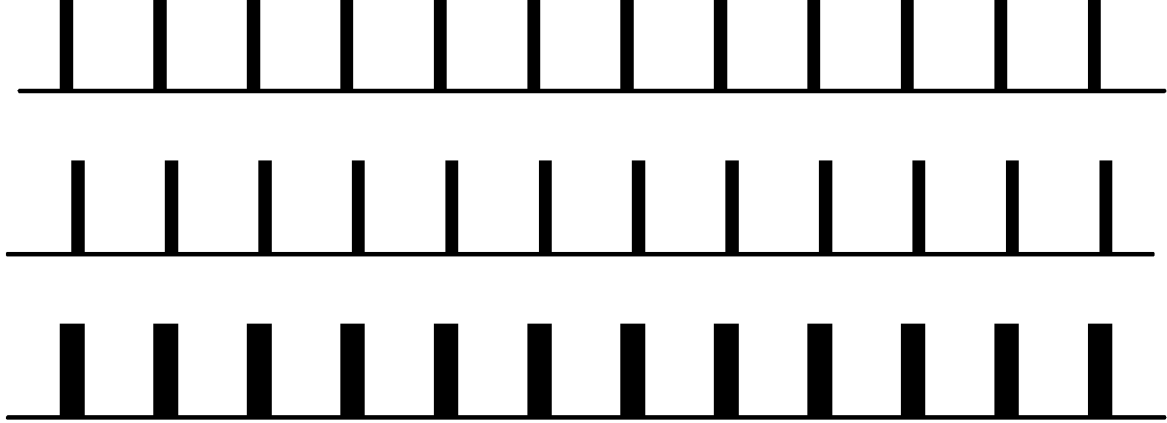
FIG. 5 is a diagram of another possible relative timing of discharges in two laser chambers according to an aspect of an embodiment.

With reference now to FIG. 5, the timing differential Δt between the firing of the two lasers can essentially be set at any value including zero (assuming the optics can withstand a doubled instantaneous power level) or small enough that the two pulses occur not simultaneously but one immediately after the other (that is, during the same exposure) thus doubling effective dosing as shown in the figure. The top timing diagram shows a possible timing of firing of the first laser chamber module 50 and middle timing diagram shows a possible timing of firing the second laser chamber module 52. Thus the beams from the two lasers can be generated one immediately after the other as shown to combined to achieve an effective dosing that is twice the dosing of either of the two lasers as shown in the bottom timing diagram.

According to another aspect of an embodiment both chambers are operated simultaneously but if an end user desires a lower power then only one or the other of the chambers can be used. Which of the chambers is used for single chamber operation can be alternated to balance the wear on the chambers and maximize lifetime.

It should be noted that there may be circumstances in which the power of both lasers firing simultaneously could damage the system optics. Such circumstances, it may be beneficial to include control circuitry which prevents a simultaneous firing. Such lasers could be fired one immediately after the other, however, to achieve a higher dose per interval without damaging the optics.

According to another aspect of an embodiment, one or both of the line narrowing modules 54 and 56 as shown in FIG. 3 can be configured to produce two wavelengths, i.e. a two color output. The wavelengths may be peak separations around a center wavelength. In the case where both of the line narrowing modules are configured to produce two wavelengths in this fashion, the peak separations may be the same or they may be different. Using such an arrangement, up to four wavelengths can be produced.

Figure 6:
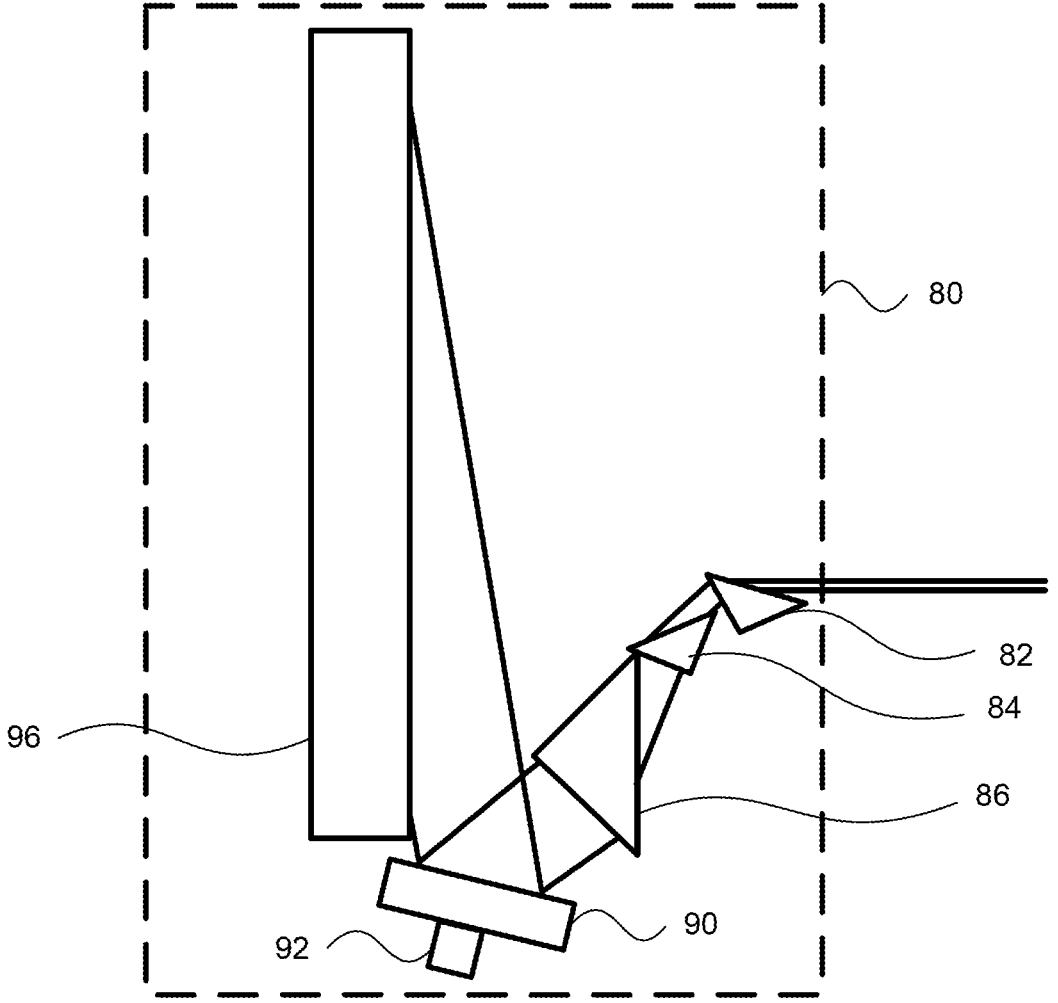
FIG. 6 is a diagram of a line narrowing module such as may advantageously be used according to an aspect of an embodiment.

As shown in FIG. 6, a line narrowing module 80 which may serve as one or both of line narrowing modules 54 and 56 of FIG. 3 may include prisms 82, 84, and 86 which together constitute a prism beam expander, a minor 90 with an actuator 92, and a grating 96. The angle of the beam incident on the grating 96 determines the wavelength of the laser. Therefore, adjusting this angle effects wavelength adjustment of the laser. A dual-peak spectrum can be generated in the line narrowing module 80 pulse-to-pulse by actuation of prisms (dither) or a split mirror 90 or a split grating 96.

Figure 7:
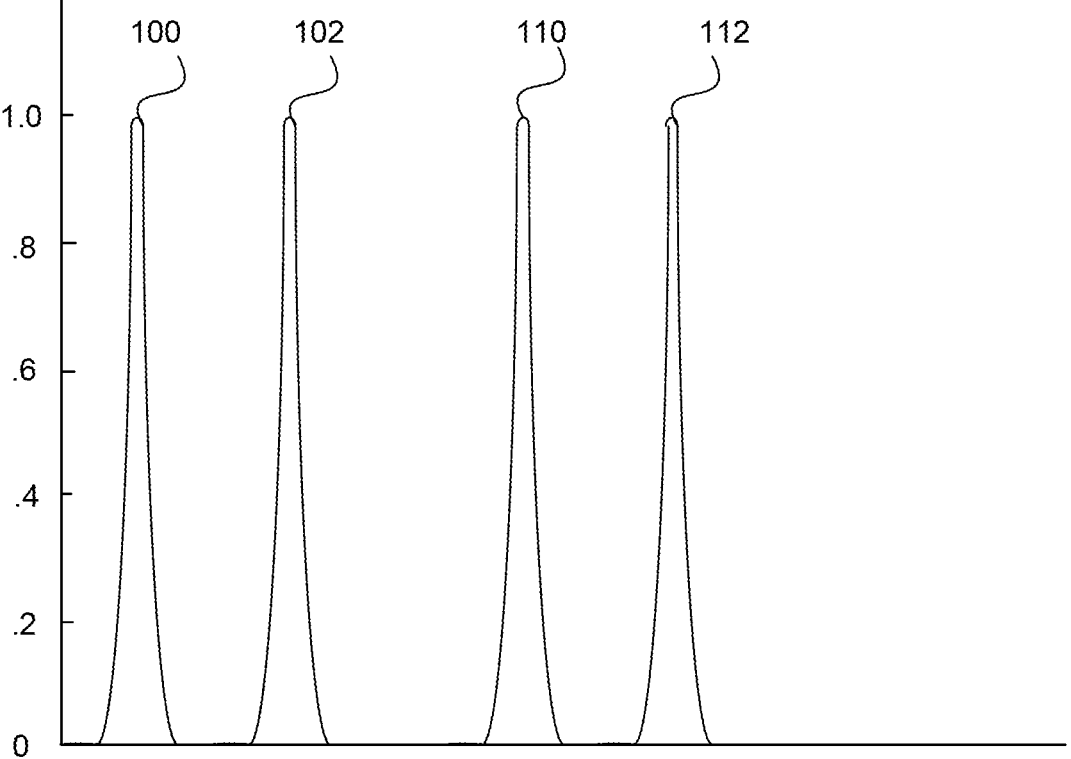
FIG. 7 is a conceptual graph of an output spectrum such as may be generated according to an aspect of an embodiment.

FIG. 7 shows an example output spectrum for the case where both line narrowing modules are configured for two color output. The x-axis is wavelength in arbitrary units and the y axis is intensity in arbitrary units. Peaks 100 and 102 are produced by the first laser chamber module 50 and the peaks 110 and 112 are produced by the second laser chamber module 52. This four wavelength spectrum can be useful in exposing thicker photoresists and may serve as an alternate (or supplement) to meeting a higher power requirement.

The firing pattern of the lasers can be "tic-toc" in which first one laser fires, then the other, and then the first again, and so on, with the intervals between firing being the same, or "stutter" in which the interval between the two lasers firing is less than half the interval between successive firings of the same laser.

As mentioned, the beam from the first laser chamber module 50 and the beam from the second laser chamber module 52 may be combined by a beam combiner 66.

Another way to combine the two beams, if they have different wavelengths, is to use a dichroic mirror. The dichroic minor works in such a way that one wavelength (short-pass) gets transmitted and another wavelength gets reflected. Another technology for combining two laser beams having the same or differing wavelengths involves the use of a pick-off mirror. Another arrangement for combining two beams involves a minor having a reflective coating 130 applied on a portion of the mirror. One laser beam may be reflected off of the reflective coating while the other propagates through the portion of mirror having no coating. Yet another arrangement for combining two beams involves causing the beams to strike a mirror with the mirror in a first position in which one beam propagates in a direction of use while the second beam propagates in another direction, and then moving the mirror to a second position (e.g., by rotation) so that only the second beam propagates in the direction of use. The same effect can be achieved by keeping the mirror stationary and dithering the propagation direction of one or both of the beams.

The foregoing description is in terms of two laser chambers as a concrete example, but it will be apparent that more than two chambers may be used, with one or more of the chambers being configured to generate laser radiation having multiple frequencies.

A single system with two laser chambers with shared ancillary systems is more compact than two complete laser systems, may have a lower cost of operation than for a MOPA laser for 60 W or less, may provide more accurate wavelength control than can be effected by dithering wavelength on a single laser, and may permit high repetition rates which in turn provide potential for better dose control.

There also may be more than two laser chamber modules present and being used, or being available for use. For example, a MOPA/MOPA chamber pair could be incorporated into the system to provide higher repetition rates or power. (Similarly, a dual-"MOPRA" chamber pair could be incorporated into the system, in which the power amplifiers include some optical recirculation through gain media. MOPA/MOPRA pairs are also contemplated.) These chambers could be made physically compact because a lower repetition rate of each individually could be used.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Other aspects of the invention are set out in the following numbered clauses.

1. A gas discharge laser system comprising:

a first laser chamber module adapted to generate a first beam of laser radiation at a first wavelength;

a second laser chamber module adapted to generate a second beam of laser radiation at a second wavelength different from the first wavelength; and a beam combiner arranged to receive the first beam and the second beam and adapted to propagate the first beam and the second beam along a common output beam path.

2. A gas discharge laser system as in clause 1 wherein the first laser chamber module comprises a first excimer laser chamber module.

3. A gas discharge laser system as in clause 2 wherein the first excimer laser chamber module comprises an ArF laser chamber module.

4. A gas discharge laser system as in clause 2 wherein the first excimer laser chamber module comprises a KrF laser chamber module.

5. A gas discharge laser system as in any one of clauses 1-4 wherein the second laser chamber module comprises a second excimer laser chamber module.

6. A gas discharge laser system as in clause 5 wherein the second excimer laser chamber module is an ArF laser chamber module.

7. A gas discharge laser system as in clause 5 wherein the second excimer laser chamber module is a KrF laser chamber module.

8. A gas discharge laser system as in clause 1 further comprising a third laser chamber module adapted to generate a third beam of laser radiation and wherein the beam combiner is arranged to receive the third beam and adapted to propagate the third beam along the common output beam path.

9. A gas discharge laser system as in clause 1 further comprising a discharge timing circuit arranged to control a relative timing of discharge in the first laser chamber module with respect to the second laser chamber module.

10. A gas discharge laser system as in clause 9 wherein the discharge timing circuit is adapted to control the relative timing of discharge in the first laser chamber module with respect to the second laser chamber module such that the first laser chamber module discharges at a first repetition rate and the second laser chamber module discharges at a second repetition rate substantially the same as the first repetition rate and offset relative to the first repetition rate by half the period of the first repetition rate.

11. A gas discharge laser system as in clause 9 wherein the discharge timing circuit is adapted to control the relative timing of discharge in the first laser chamber module with respect to the second laser chamber module such that the first laser chamber module and the second laser chamber module discharge at substantially the same repetition rate, and wherein the second laser chamber module discharges substantially immediately after the first laser chamber module finishes discharging.

12. A gas discharge laser system as in clause 9 wherein the discharge timing circuit is adapted to control the relative timing of discharge in the first laser chamber module with respect to the second laser chamber module such that the first laser chamber module and the second laser chamber module discharge at substantially the same time.

13. A gas discharge laser system as in clause 9 wherein the discharge timing circuit is adapted to control the relative timing of discharge in the first laser chamber module with respect to the second laser chamber module such that the first laser chamber module and the second laser chamber module do not discharge at substantially the same time.

14. A gas discharge laser system as in clause 9 wherein the discharge timing circuit is adapted to generate a common command to fire both the first laser chamber module and the second laser chamber module.

15. A gas discharge laser system as in clause 14 wherein the first laser chamber module is adapted to fire without a delay after the common command.

16. A gas discharge laser system as in clause 14 wherein the first laser chamber module is adapted to fire with a delay after the common command.

17. A gas discharge laser system as in any one of clauses 14, 15, and 16 wherein the second laser chamber module is adapted to fire without a delay after the common command.

18. A gas discharge laser system as in any one of clauses 14, 15, and 16 wherein the second laser chamber module is adapted to fire with a delay after the common command.

19. A gas discharge laser system as in clause 9 wherein the discharge timing circuit is adapted to generate a first command to fire the first laser chamber module and a second command to fire the second laser chamber module.

20. A gas discharge laser system as in clause 19 wherein the first laser chamber module is adapted to fire without a delay after the first command.

21. A gas discharge laser system as in clause 19 wherein the first laser chamber module is adapted to fire with a delay after the first command.

22. A gas discharge laser system as in any one of clauses 19, 20, and 21 wherein the second laser chamber module is adapted to fire without a delay after the second command.

23. A gas discharge laser system as in any one of clauses 19, 20, and 21 wherein the second laser chamber module is adapted to fire with a delay after the command.

24. A gas discharge laser system as in clause 1 in which the first laser chamber module is fired at a first repetition rate and the second laser chamber module is fired at a second repetition rate different from the first repetition rate.

25. A gas discharge laser system as in clause 24 in which a discharge rate ratio of the first repetition rate to the second repetition rate is a ratio of two integers.

26. A gas discharge laser as in clause 25 wherein the ratio of two integers is 2:1.

27. A gas discharge laser as in clause 25 wherein the ratio of two integers is 3:2.

28. A gas discharge laser system as in clause 1 further comprising a control system adapted to control both of the first laser chamber module and the second laser chamber module.

29. A gas discharge laser system as in clause 1 further comprising a gas supply system adapted to supply gas to both of the first laser chamber module and the second laser chamber module.

30. A gas discharge laser system as in clause 1 further comprising a first laser chamber metrology unit arranged to measure a parameter of the light beam generated by the first laser chamber module.

31. A gas discharge laser system as in clause 1 or 30 further comprising a second laser chamber metrology unit arranged to measure a parameter of the light beam generated by the second laser chamber module.

32. A gas discharge laser system as in any one of clauses 1, 30 or 31 further comprising a combined beam metrology unit arranged to measure a parameter of a combination of the light beam generated by the first laser chamber module and the light beam generated by the second laser chamber module.

33. A gas discharge laser system as in clause 30 further comprising a control unit arranged to receive an output from the first laser chamber metrology unit and configured to control a wavelength of the light beam generated by the first laser chamber module based at least in part on the output of the first laser chamber metrology unit.

34. A gas discharge laser system as in clause 30 or 33 further comprising a control unit arranged to receive an output from the second laser chamber metrology unit and configured to control a wavelength of the light beam generated by the second laser chamber module based at least in part on the output of the second laser chamber metrology unit.

35. A gas discharge laser system as in clause 32 further comprising a control unit arranged to receive the output of the combined beam metrology unit and configured to control a spectrum of a combination of the light beam generated by the first laser chamber module and the light beam generated by the second laser chamber module based at least in part on the output of the combined beam metrology unit.

36. A gas discharge laser system as in clause 1 further comprising a first laser chamber line narrowing module arranged to receive the light beam from the first laser chamber module and configured to narrow the bandwidth of the light beam from the first laser chamber module.

37. A gas discharge laser system as in clause 36 further comprising a second laser chamber line narrowing module arranged to receive the light beam from the second laser chamber module and configured to narrow the bandwidth of the light beam from the second laser chamber module.

38. A gas discharge laser system as in clause 36 further comprising: a second laser chamber line narrowing module arranged to receive the light beam from the second laser chamber module and configured to narrow the bandwidth of the light beam from the second laser chamber module, and a control unit connected to the first laser chamber line narrowing module and second laser chamber line narrowing module and adapted to control the first laser chamber line narrowing module and second laser chamber line narrowing module so that the first bandwidth is substantially the same as the second bandwidth.

39. A gas discharge laser system as in clause 36 further comprising: a second laser chamber line narrowing module arranged to receive the light beam from the second laser chamber module and configured to narrow the bandwidth of the light beam from the second laser chamber module, and a control unit connected to the first laser chamber line narrowing module and second laser chamber line narrowing module and adapted to control the first laser chamber line narrowing module and second laser chamber line narrowing module so that the first bandwidth is different from the second bandwidth.

40. A lithography apparatus comprising:
a first laser chamber module adapted to generate first beam of laser radiation at a first wavelength;
a second laser chamber module adapted to generate a second beam of laser radiation at a second wavelength different from the first wavelength;

a beam combiner arranged to receive the first beam and the second beam and adapted to propagate the first beam and the second beam along a common output beam path; and a scanner arranged to receive the first beam and the second beam, wherein the scanner is configured to provide an instruction for adjusting the first and second wavelengths.

41. A lithography apparatus as in clause 40 further comprising a discharge timing circuit arranged to control a relative timing of discharge in the first laser chamber module with respect to the second laser chamber module.

42. A lithography apparatus as in clause 41 wherein the discharge timing circuit is adapted to control the relative timing of discharge in the first laser chamber module with respect to the second laser chamber module such that the first laser chamber module and the second laser chamber module discharge at substantially the same repetition rate and 180 degrees out of phase with each other.

43. A lithography apparatus as in clause 41 wherein the discharge timing circuit is adapted to control the relative timing of discharge in the first laser chamber module with respect to the second laser chamber module such that the first laser chamber module and the second laser chamber module discharge at substantially the same repetition rate, and wherein the second laser chamber module discharges substantially immediately after the first laser chamber module finishes discharging.

44. A lithography apparatus as in clause 41 wherein the discharge timing circuit is adapted to control the relative timing of discharge in the first laser chamber module with respect to the second laser chamber module such that the first laser chamber module and the second laser chamber module discharge at substantially the same time.

45. A lithography apparatus as in clause 41 wherein the discharge timing circuit is adapted to control the relative timing of discharge in the first laser chamber module with respect to the second laser chamber module such that the first laser chamber module and the second laser chamber module do not discharge at substantially the same time.

46. A lithography apparatus as in clause 40 further comprising a control system adapted to control both the first laser chamber module and the second laser chamber module.

47. A lithography apparatus as in clause 40 further comprising a gas supply system adapted to supply gas to both the first laser chamber module and the second laser chamber module.

48. A method of exposing a substrate in a lithography apparatus, the method comprising the steps of:
receiving, from a scanner, an indication of one or more target wavelengths;
generating, in response to the indication, a first beam of laser radiation at a first wavelength using a first laser chamber module;
generating, in response to the indication, a second beam of laser radiation at a second wavelength different from the first wavelength using a second laser chamber module;
causing the first beam and the second beam to propagate along a common output beam path; and
using the first beam and the second beam in the scanner to expose the substrate to radiation at the first wavelength and radiation at the second wavelength in a single pass.

49. A method as in clause 48 further comprising a step of controlling a relative timing of the step of generating the first beam of laser radiation at the first wavelength and generating the second beam of laser radiation at the second wavelength different from the first wavelength.

50. A method as in clause 49 wherein the step of controlling a relative timing of the step of generating the first beam of laser radiation at the first wavelength and generating the second beam of laser radiation at the second wavelength different from the first wavelength comprises generating the first beam of laser radiation and the second beam of laser radiation at substantially the same repetition rate and 180 degrees out of phase with each other.

51. A method as in clause 49 wherein the step of controlling a relative timing of the step of generating the first beam of laser radiation at the first wavelength and generating the second beam of laser radiation at the second wavelength different from the first wavelength comprises generating the first beam of laser radiation and the second beam of laser radiation at substantially the same repetition rate and generating the second beam substantially immediately after generating the first beam.

52. A method as in clause 49 wherein the step of controlling a relative timing of the step of generating the first beam of laser radiation at the first wavelength and generating the second beam of laser radiation at the second wavelength different from the first wavelength comprises generating the first beam of laser radiation and the second beam of laser radiation at substantially the same time.

53. A method as in clause 49 wherein the step of controlling a relative timing of the step of generating the first beam of laser radiation at the first wavelength and generating the second beam of laser radiation at the second wavelength different from the first wavelength comprises generating the first beam of laser radiation and the second beam of laser radiation at substantially the same time.

54. A method of exposing a substrate in a lithography apparatus, the method comprising the steps of:
    generating a first beam of laser radiation at a first wavelength using a first laser chamber module for a first number of pulses and propagating the pulses along an output beam path to the substrate; and
    generating a second beam of laser radiation at a second wavelength using a second laser chamber module for a second number of pulses and propagating the pulses along the output beam path to the substrate.

55. A method as in clause 54 wherein the first wavelength is substantially the same as the second wavelength.

56. A method as in clause 54 wherein the first wavelength is different from the second wavelength.

57. A method as in any one of clauses 54-56 in which the first number of pulses is the same as the second number of pulses.

58. A method as in any one of clauses 54-56 in which the first number of pulses is different from the second number of pulses.

59. A method as in any one of clauses 54-58 wherein the first beam has first pulse energy and the second beam has a second pulse energy different from the first pulse energy.

60. A method as in any one of clauses 54-59 further comprising a step of narrowing a bandwidth of the light beam generated by the first laser chamber module.

61. A method as in any one of clauses 54-59 further comprising a step of narrowing a bandwidth of the light beam generated by the second laser chamber module.

62. A method as in clause 54 further comprising a step of narrowing a bandwidth of the light beam generated by the first laser chamber module a first amount and narrowing a bandwidth of the light beam generated by the second laser chamber module a second amount different from the first amount.

63. A method as in clause 54 further comprising a step of generating a command signal wherein the steps of generating a first beam of laser radiation and generating a second beam of laser radiation are carried out in response to the command signal.

64. A method as in clause 54 further comprising a step of generating a first command signal and the step of generating a second command signal, and wherein the step of generating a first beam of laser radiation is carried out in response to the first command signal and the step of generating a second command signal, and wherein the step of generating a second beam of laser radiation is carried out in response to the second command signal.

65. A gas discharge laser system comprising:
    a first laser chamber module adapted to generate a first beam of laser radiation having a first spectrum having a first wavelength and a second wavelength different from the first wavelength;
    a second laser chamber module adapted to generate a second beam of laser radiation having a second spectrum having a third wavelength different from the first and second wavelength and a fourth wavelength different from the first, second, and third wavelength; and
    a beam combiner arranged to receive the first beam and the second beam and adapted to propagate the first beam and the second beam along a common output beam path.

66. A gas discharge laser system as in clause 65, further comprising a discharge timing circuit arranged to control a relative timing of discharge in the first laser chamber module with respect to the second laser chamber module.

67. A gas discharge laser system as in clause 66 wherein the discharge timing circuit is adapted to control the relative timing of discharge in the first laser chamber module with respect to the second laser chamber module such that the first laser chamber module discharges at a first repetition rate and the second laser chamber module discharges at a second repetition rate substantially the same as the first repetition rate and offset relative to the first repetition rate by half the period of the first repetition rate.

68. A gas discharge laser system as in clause 66 wherein the discharge timing circuit is adapted to control the relative timing of discharge in the first laser chamber module with respect to the second laser chamber module such that the first laser chamber module and the second laser chamber module discharge at substantially the same repetition rate, and wherein the second laser chamber module discharges substantially immediately after the first laser chamber module finishes discharging.

69. A gas discharge laser system as in clause 66 wherein the discharge timing circuit is adapted to control the relative timing of discharge in the first laser chamber module with respect to the second laser chamber module such that the first laser chamber module and the second laser chamber module discharge at substantially the same time.

70. A gas discharge laser system as in clause 65 wherein the first laser chamber module comprises a first laser chamber line narrowing module configured to cause the first laser chamber module to generate the first beam of laser radiation having the first spectrum.

71. A gas discharge laser system as in clause 70 wherein the second laser chamber module comprises a second laser chamber line narrowing module configured to cause the second laser chamber module to generate the second beam of laser radiation having the second spectrum.

72. A method of exposing a substrate in a lithography apparatus, the method comprising the steps of:

generating a first beam of laser radiation at a first wavelength and a second wavelength using a first laser chamber module;

generating a second beam of laser radiation at a third wavelength and a fourth wavelength, the first, second, third, and fourth wavelengths being different from one another;

causing the first beam and the second beam to propagate along a common output beam path; and using the first beam and the second beam in the scanner to expose the substrate to radiation at the first wavelength and radiation at the second wavelength in a single pass.

73. A method as in clause 72 further comprising a step of controlling a relative timing of the step of generating the first beam of laser radiation and the second beam of laser radiation.

74. A method as in clause 73 wherein the step of controlling the relative timing of the step of generating the first beam of laser radiation and the second beam of laser radiation comprises generating the first beam of laser radiation and the second beam of laser radiation at substantially the same repetition rate and 180 degrees out of phase with each other.

75. A method as in clause 73 wherein the step of controlling a relative timing of the step of generating the first beam of laser radiation and the second beam of laser radiation comprises generating the first beam of laser radiation and the second beam of laser radiation at substantially the same repetition rate and generating the second beam substantially immediately after generating the first beam.

76. A method as in clause 73 wherein the step of controlling the relative timing of the step of generating the first beam of laser radiation and the second beam of laser radiation comprises generating the first beam of laser radiation and the second beam of laser radiation at substantially the same time.

Still other implementations are within the scope of the claims.

What is claimed is:

1. A gas discharge laser system comprising:
a first laser chamber module adapted to generate a first beam of laser radiation at a first wavelength;
a second laser chamber module adapted to generate a second beam of laser radiation at a second wavelength different from the first wavelength; and
a beam combiner arranged to receive the first beam and the second beam and adapted to propagate the first beam and the second beam along a common output beam path; and
a discharge timing circuit arranged to control a relative timing of discharge in the first laser chamber module with respect to the second laser chamber module.

2. The gas discharge laser system as claimed in claim 1 wherein the first laser chamber module comprises a first excimer laser chamber module.

3. The gas discharge laser system as claimed in claim 2 wherein the first excimer laser chamber module comprises an ArF laser chamber module.

4. The gas discharge laser system as claimed in claim 2 wherein the first excimer laser chamber module comprises a KrF laser chamber module.

5. The gas discharge laser system as claimed in claim 2, wherein the second laser chamber module comprises a second excimer laser chamber module.

6. The gas discharge laser system as claimed in claim 5 wherein the second excimer laser chamber module is an ArF laser chamber module.

7. The gas discharge laser system as claimed in claim 1 wherein the discharge timing circuit is adapted to control the relative timing of discharge in the first laser chamber module with respect to the second laser chamber module such that the first laser chamber module discharges at a first repetition rate and the second laser chamber module discharges at a second repetition rate substantially the same as the first repetition rate and offset relative to the first repetition rate by half the period of the first repetition rate.

8. The gas discharge laser system as claimed in claim 1 wherein the discharge timing circuit is adapted to control the relative timing of discharge in the first laser chamber module with respect to the second laser chamber module such that the first laser chamber module and the second laser chamber module discharge at substantially the same repetition rate, and wherein the second laser chamber module discharges substantially immediately after the first laser chamber module finishes discharging.

9. The gas discharge laser system as claimed in claim 1 wherein the discharge timing circuit is adapted to control the relative timing of discharge in the first laser chamber module with respect to the second laser chamber module such that the first laser chamber module and the second laser chamber module discharge at substantially the same time.

10. The gas discharge laser system as claimed in claim 1 wherein the discharge timing circuit is adapted to generate a common command to fire both the first laser chamber module and the second laser chamber module and the first laser chamber module is adapted to fire without a delay after the common command.

11. The gas discharge laser system as claimed in claim 1 wherein the discharge timing circuit is adapted to generate a common command to fire both the first laser chamber module and the second laser chamber module and the first laser chamber module is adapted to fire with a delay after the common command.

12. The gas discharge laser system as claimed in claim 1 wherein the discharge timing circuit is adapted to generate a first command to fire the first laser chamber module and a second command to fire the second laser chamber module and the first laser chamber module is adapted to fire without a delay after the first command.

13. The gas discharge laser system as claimed in claim 1 wherein the discharge timing circuit is adapted to generate a first command to fire the first laser chamber module and a second command to fire the second laser chamber module and the first laser chamber module is adapted to fire with a delay after the first command.

14. The gas discharge laser system as claimed in claim 12 wherein the second laser chamber module is adapted to fire with a delay after the second command.

15. A lithography apparatus comprising:
a first laser chamber module adapted to generate first beam of laser radiation at a first wavelength;
a second laser chamber module adapted to generate a second beam of laser radiation at a second wavelength different from the first wavelength;
a beam combiner arranged to receive the first beam and the second beam and adapted to propagate the first beam and the second beam along a common output beam path; and a scanner arranged to receive the first beam and the second beam, wherein the scanner is configured to provide an instruction for adjusting the first and second wavelengths.

16. The lithography apparatus as claimed in claim 15 further comprising a discharge timing circuit arranged to control a relative timing of discharge in the first laser chamber module with respect to the second laser chamber module.

17. A method of exposing a substrate in a lithography apparatus, the method comprising the steps of:

generating a first beam of laser radiation at a first wavelength using a first laser chamber module for a first number of pulses and propagating the pulses along an output beam path to the substrate; and generating a second beam of laser radiation at a second wavelength different from the first wavelength using a second laser chamber module for a second number of pulses and propagating the pulses along the output beam path to the substrate.

18. The method as claimed in claim 17 wherein the first beam has first pulse energy and the second beam has a second pulse energy different from the first pulse energy.

19. The method as claimed in claim 17 further comprising a step of narrowing a bandwidth of the light beam generated by the first laser chamber module a first amount and narrowing a bandwidth of the light beam generated by the second laser chamber module a second amount different from the first amount.

20. A gas discharge laser system comprising:

a first laser chamber module adapted to generate a first beam of laser radiation having a first spectrum having a first wavelength and a second wavelength different from the first wavelength;

a second laser chamber module adapted to generate a second beam of laser radiation having a second spectrum having a third wavelength different from the first and second wavelength and a fourth wavelength different from the first, second, and third wavelength; and a beam combiner arranged to receive the first beam and the second beam and adapted to propagate the first beam and the second beam along a common output beam path.

21. The gas discharge laser system as claimed in claim 20, further comprising a discharge timing circuit arranged to control a relative timing of discharge in the first laser chamber module with respect to the second laser chamber module.

22. The gas discharge laser system as claimed in claim 21 wherein the discharge timing circuit is adapted to control the relative timing of discharge in the first laser chamber module with respect to the second laser chamber module such that the first laser chamber module and the second laser chamber module discharge at substantially the same repetition rate, and wherein the second laser chamber module discharges substantially immediately after the first laser chamber module finishes discharging.

23. A gas discharge laser system as claimed in claim 21 wherein the discharge timing circuit is adapted to control the relative timing of discharge in the first laser chamber module with respect to the second laser chamber module such that the first laser chamber module and the second laser chamber module discharge at substantially the same time.

24. The gas discharge laser system as claimed in claim 21 wherein the first laser chamber module comprises a first laser chamber line narrowing module configured to cause the first laser chamber module to generate the first beam of laser radiation having the first spectrum and the second laser chamber module comprises a second laser chamber line narrowing module configured to cause the second laser chamber module to generate the second beam of laser radiation having the second spectrum.

25. A method of exposing a substrate in a lithography apparatus, the method comprising the steps of:

receiving, from a scanner, an indication of one or more target wavelengths;

generating, in response to the indication, a first beam of laser radiation at a first wavelength using a first laser chamber module;

generating, in response to the indication, a second beam of laser radiation at a second wavelength different from the first wavelength using a second laser chamber module;

causing the first beam and the second beam to propagate along a common output beam path; and using the first beam and the second beam in the scanner to expose the substrate to radiation at the first wavelength and radiation at the second wavelength in a single pass.

26. The method as claimed in claim 25 further comprising a step of controlling a relative timing of the step of generating the first beam of laser radiation at the first wavelength and generating the second beam of laser radiation at the second wavelength different from the first wavelength.

27. The method as claimed in claim 26 wherein the step of controlling a relative timing of the step of generating the first beam of laser radiation at the first wavelength and generating the second beam of laser radiation at the second wavelength different from the first wavelength comprises generating the first beam of laser radiation and the second beam of laser radiation at substantially the same repetition rate and generating the second beam substantially immediately after generating the first beam.

28. A method of exposing a substrate in a lithography apparatus, the method comprising the steps of:

generating a first beam of laser radiation at a first wavelength and a second wavelength using a first laser chamber module;

generating a second beam of laser radiation at a third wavelength and a fourth wavelength, the first, second, third, and fourth wavelengths being different from one another;

causing the first beam and the second beam to propagate along a common output beam path; and using the first beam and the second beam in the scanner to expose the substrate to radiation at the first wavelength and radiation at the second wavelength in a single pass.

29. The method as claimed in claim 28 further comprising a step of controlling a relative timing of the first beam of laser radiation and the second beam of laser radiation by generating the first beam of laser radiation and the second beam of laser radiation at substantially the same time.

30. A gas discharge laser system comprising:

a first laser chamber module adapted to generate a first beam of laser radiation at a first wavelength;

a second laser chamber module adapted to generate a second beam of laser radiation at a second wavelength different from the first wavelength; and a beam combiner arranged to receive the first beam and the second beam and adapted to propagate the first beam and the second beam along a common output beam path,

US 12,586,978 B2

23 the first laser chamber module being fired at a first repetition rate and the second laser chamber module is fired at a second repetition rate different from the first repetition rate.

31. The gas discharge laser system as claimed in claim 30 further comprising a gas supply system adapted to supply gas to both the first laser chamber module and the second laser chamber module.

32. A gas discharge laser system comprising:
a first laser chamber module adapted to generate a first beam of laser radiation at a first wavelength;
a second laser chamber module adapted to generate a second beam of laser radiation at a second wavelength different from the first wavelength;
a beam combiner arranged to receive the first beam and the second beam and adapted to propagate the first beam and the second beam along a common output beam path; and
a combined beam metrology unit arranged to measure a parameter of a combination of the light beam generated by the first laser chamber module and the light beam generated by the second laser chamber module.

33. The gas discharge laser system as claimed in claim 32 further comprising a control unit arranged to receive the output of the combined beam metrology unit and configured to control a spectrum of a combination of the light beam generated by the first laser chamber module and the light beam generated by the second laser chamber module based at least in part on the output of the combined beam metrology unit.

34. A gas discharge laser system comprising:
a first laser chamber module adapted to generate a first beam of laser radiation at a first wavelength;
a second laser chamber module adapted to generate a second beam of laser radiation at a second wavelength different from the first wavelength;
a beam combiner arranged to receive the first beam and the second beam and adapted to propagate the first beam and the second beam along a common output beam path; and

a gas supply system adapted to supply gas to both the first laser chamber module and the second laser chamber module.

35. The gas discharge laser system as claimed in claim 34 further comprising a gas supply system adapted to supply gas to both the first laser chamber module and the second laser chamber module.

36. A gas discharge laser system comprising:
a first laser chamber module adapted to generate a first beam of laser radiation at a first wavelength;
a second laser chamber module adapted to generate a second beam of laser radiation at a second wavelength different from the first wavelength;
a beam combiner arranged to receive the first beam and the second beam and adapted to propagate the first beam and the second beam along a common output beam path; and
a first laser chamber line narrowing module arranged to receive the light beam from the first laser chamber module and configured to narrow the bandwidth of the light beam from the first laser chamber module.

37. The gas discharge laser system as claimed in claim 36 further comprising: a second laser chamber line narrowing module arranged to receive the light beam from the second laser chamber module and configured to narrow the bandwidth of the light beam from the second laser chamber module, and a control unit connected to the first laser chamber line narrowing module and second laser chamber line narrowing module and adapted to control the first laser chamber line narrowing module and second laser chamber line narrowing module so that the first bandwidth is different from the second bandwidth.

38. The gas discharge laser system as claimed in claim 36 further comprising a gas supply system adapted to supply gas to both the first laser chamber module and the second laser chamber module.

* * * * *